United States Patent
Kumakura

(10) Patent No.: US 6,452,111 B1
(45) Date of Patent: Sep. 17, 2002

(54) ADHESIVES AND ADHESIVE FILMS

(75) Inventor: Hiroyuki Kumakura, Kanuma (JP)

(73) Assignee: Sony Chemicals Corp., Tokyo (JP)

(*) Notice: Subject to any disclaimer, the term of this patent is extended or adjusted under 35 U.S.C. 154(b) by 0 days.

(21) Appl. No.: 09/976,162

(22) Filed: Oct. 15, 2001

(30) Foreign Application Priority Data

Oct. 16, 2000 (JP) ....................................... 2000-314595

(51) Int. Cl.$^7$ ................................................ H05K 1/02
(52) U.S. Cl. ...................... 174/259; 174/260; 29/832; 257/783; 428/343; 438/119
(58) Field of Search ................................ 174/259, 260; 29/832, 846; 257/778, 701, 783; 361/757; 428/343, 344; 156/60; 438/118, 119

(56) References Cited

U.S. PATENT DOCUMENTS

| | | | | |
|---|---|---|---|---|
| 5,620,795 A | * | 4/1997 | Haak et al. | 428/344 |
| 5,685,939 A | * | 11/1997 | Wolk et al. | 156/234 |
| 6,077,382 A | * | 6/2000 | Watanabe | 29/832 |
| 6,223,429 B1 | * | 5/2001 | Kaneda et al. | 29/832 |
| 6,340,607 B1 | * | 1/2002 | Yamada | 438/119 |

OTHER PUBLICATIONS

"Plastics—Polymers/resins in the liquid state or as emulsions or dispersions–Determination of viscosity using a rotational viscometer with defined shear rate", Japanese Industrial Standard, K 7117–2; 1999.

"Plastics—Polymers/resins in the liquid state or as emulsions or dispersions–Determination of viscosity using a rotational viscometer with defined shear rate", International Standard, IDS 3219; 1993.

* cited by examiner

Primary Examiner—Albert W. Paladini
(74) Attorney, Agent, or Firm—Oliff & Berridge, PLC

(57) ABSTRACT

Provided is an electrically conductive adhesive capable of reliably connecting a semiconductor element and a flexible wiring board without causing short circuits. When electrically conductive adhesives of the present invention containing conductive particles having an average diameter of from 10 nm or more to 90 nm or less are used to connect a flexible wiring board and a semiconductor element, the signal part of a wiring film under a protective film is protected and no short circuit occurs in wiring films of the resulting electric device because conductive particles do not break through the protective film of the semiconductor element.

8 Claims, 5 Drawing Sheets

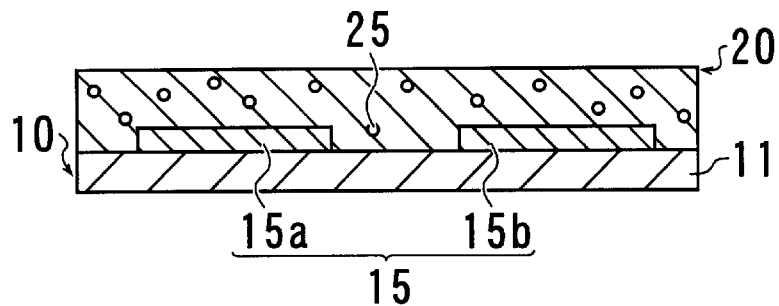
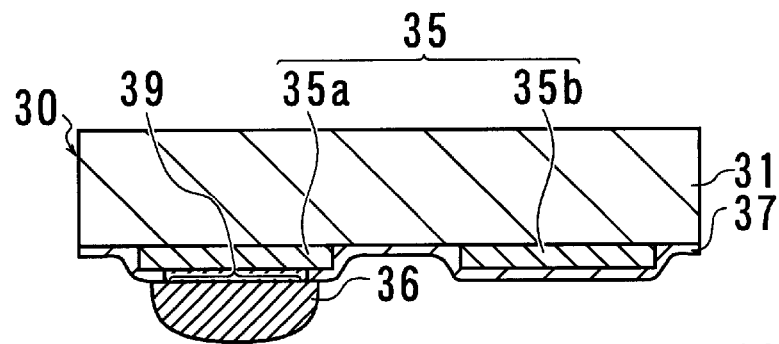
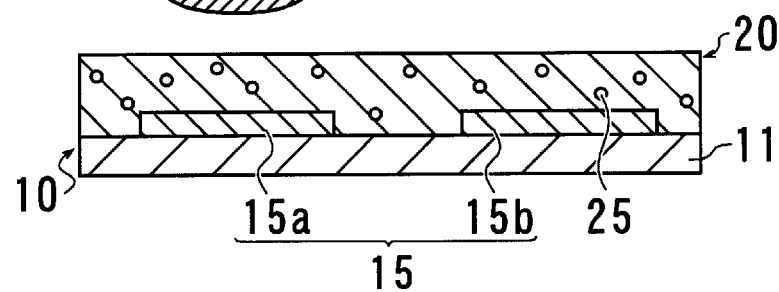
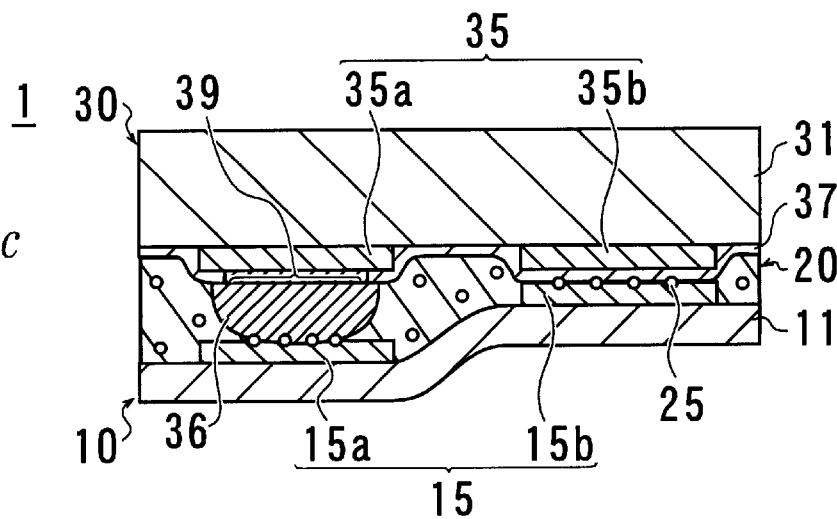

ADHESIVES AND ADHESIVE FILMS

FIELD OF THE INVENTION

The present invention relates to anisotropic conductive adhesives used for electric connection between a semiconductor element and a flexible wiring board, for example.

PRIOR ART

Adhesives containing conductive particles have been used as means for connecting a semiconductor element and a flexible wiring board, for example.

Reference 130 in FIG. 8(*a*) represents a semiconductor element comprising an element body 131, a wiring film 135 provided on the top of element body 131 and a protective film 137 provided on wiring film 135 and having an opening 139 at a predetermined location.

Reference 110 in FIG. 8(*a*) represents a flexible wiring board to be connected to semiconductor element 130, and the flexible wiring board 110 comprises a base film 111 and a wiring film 115 formed on base film 111.

Wiring films 115, 135 of flexible wiring board 110 and semiconductor element 130 have connector parts 115*a*, 135*a* serving for the connection described later and wiring parts 115*b*, 135*b* running around in flexible wiring board 110 and semiconductor element 130 and connected at one end to connector parts 115*a*, 135*a*, respectively.

Opening 139 in protective film 137 is located on connector part 135*a* of semiconductor element 130. In the opening 139 is provided a bump 136 upright on connector part 135*a* with the top of bump 136 projecting from the surface of protective film 137.

The flexible wiring board 110 and semiconductor element 130 are connected by first opposing the side of semiconductor element 130 having protective film 137 and the side of flexible wiring board 110 having wiring film 115 to each other and inserting an adhesive film 120 made of an adhesive containing conductive particles 125 between both, as shown in FIG. 8(*a*).

Then, adhesive film 120 is sandwiched between semiconductor element 130 and flexible wiring board 110 while aligning bump 136 on semiconductor element 130 to face connector part 115*a* of wiring film 115 of flexible wiring board 110, and the assembly is heated under pressure so that adhesive film 120 softens by heating so that the softened adhesive film 120 is displaced from the top of bump 136 of semiconductor 130 and the remaining adhesive film 120 is sandwiched between connector part 115*a* and bump 136.

FIG. 8(*b*) shows this state, in which conductive particles 125 in adhesive film 120 sandwiched between bump 136 and connector part 115*a* enter into the surface of the top of bump 136 and the surface of connector part 115*a* under pressure to connect wiring films 115, 135 via the conductive particles 125.

Reference 100 in FIG. 8(*b*) represents an electric device obtained by heating, pressing and then cooling.

As adhesive film 120 hardens when it is cooled after heating, semiconductor element 130 and flexible wiring board 110 are not only electrically but also mechanically connected via conductive particles 125 in the electric device 100.

A part of flexible wiring board 110 distant from connector part 115 to be connected to bump 136 is pressed against the surface of protective film 137 of semiconductor element 130 during heating under pressure because of its flexibility so that protective film 137 of semiconductor element 130 and wiring film 115 of flexible wiring board 110 come into close contact with each other.

As conductive particles 125 used in adhesive film 120 normally have an average particle diameter greater than the thickness of protective film 137 of semiconductor element 130 and made of a rigid metal, conductive particles 125 may break through protective film 137 under pressure when the surface of protective film 137 of semiconductor element 130 and the surface of flexible wiring board 110 come into close contact with each other.

The right half of FIG. 8(*b*) is a schematic sectional view showing that conductive particles 125 have broken through protective film 137, and the conductive particles 125 having broken through protective film 137 may come into contact with wiring parts 115*b*, 135*b* to cause short circuit in wiring films 115, 135 forming electric device 100 when wiring parts 115*b*, 135*b* of wiring films 115, 135 are faced to each other in the zone where flexible wiring board 110 and semiconductor element 130 are in close contact with each other.

With high densification of electronic components, the pattern of wiring film 135 of semiconductor 130 is becoming finer in recent years, so that when conductive particles 125 having broken through protective film 137 enter between wiring film members 135, adjacent wiring film members 135 may be electrically connected via conductive particles 125 to cause short circuit between wiring film members 135 of semiconductor element 130.

It is also possible to directly apply an adhesive on the surface of flexible wiring board 110 for connection to semiconductor element 130 without forming it into a film, but such an adhesive may readily cause connection failure because the conductive particles 125 are not homogeneously dispersed in the pasty adhesive and tend to precipitate.

The present invention was made to solve the problems of the prior art described above with the purpose of providing an adhesive film having high reliability of connection to fine-pitch circuits.

SUMMARY OF THE INVENTION

In order to solve the above problems, the present invention provides an adhesive comprising an insulating adhesive component and conductive particles dispersed in the insulating adhesive component wherein the conductive particles have an average diameter of from 10 nm or more to 90 nm or less.

The present invention provides the adhesive characterized in that the conductive particles contained in the adhesive have a specific surface area of from 5 m$^2$/g or more to 80 m$^2$/g or less.

The present invention provides the adhesive characterized in that the conductive particles contained in the adhesive represent a total volume of from more than 0.1% to less than 12% on the basis of the total volume of the insulating adhesive component and the conductive particles.

The present invention provides the adhesive characterized in that the conductive particles are based on at least one metal selected from the group consisting of nickel, palladium, copper, iron and silver.

The present invention provides the adhesive characterized in that the insulating adhesive component preferably contains an epoxy resin and an imidazole-based latent curing agent.

The present invention provides the adhesive characterized in that the adhesive has a viscosity of 1000 Pa.s or less at 25° C.

The present invention provides an adhesive film made of an adhesive in the form of a film comprising an insulating adhesive component and conductive particles dispersed in the insulating adhesive component wherein the conductive particles have an average diameter of from 10 nm or more to 90 nm or less.

The present invention provides an electric device comprising a semiconductor element and a wiring board, wherein the semiconductor element is adhesively bonded to the wiring board with the adhesive comprising an insulating adhesive component and conductive particles dispersed in the insulating adhesive component wherein the conductive particles have an average diameter of from 10 nm or more to 90 nm or less.

BRIEF DESCRIPTION OF THE DRAWINGS

FIGS. 3(a)–(c) is a diagram for illustrating a process for connecting a semiconductor element and a flexible wiring board using an adhesive of the present invention.

Various numeral references represent the following elements: 25, 45, conductive particles; 40, adhesive film.

DETAILED DESCRIPTION OF PREFERRED EMBODIMENTS OF THE INVENTION

Adhesives of the present invention will now be explained in detail.

EXAMPLE 1

Thirty parts by weight of naphthalene-type epoxy resin (available from Dainippon Ink & Chemicals, Incorporated under trade name "HP4032D") belonging to the thermosetting resin, 18 parts by weight of a glycidyl amine resin (available from Sumitomo Chemical under trade name "ELM100") also belonging to the thermosetting resin, 50 parts by weight of a latent curing agent for curing the two thermosetting resins (available from Asahi Chemical Industry under trade name "HX3721", average particle diameter 5 $\mu$m) and 2 parts by weight of a coupling agent (available from Nippon Unicar under trade name "A-187") were mixed to give a pasty insulating adhesive component.

Then, the insulating adhesive component was combined and mixed with conductive particles to give an adhesive of the present invention containing the conductive particles in a volume of 2 vol % of the total volume. The conductive particles used here were nickel particles having an average particle diameter of 10 nm.

The adhesive does not harden because no polymerization reaction occurs in the epoxy resin in the presence of the latent curing agent, which is dispersed in the adhesive but not dissolved at normal temperatures.

Next, a process for bonding a semiconductor element and a flexible wiring board using the adhesive of the present invention is explained.

Figure 1:
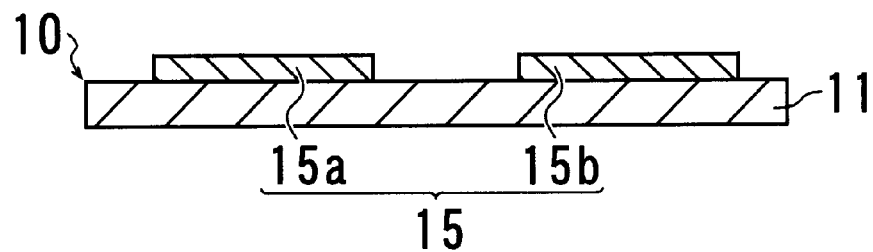
FIG. 1 is a diagram for illustrating a flexible wiring board to be connected using an adhesive of the present invention.
Figure 2:
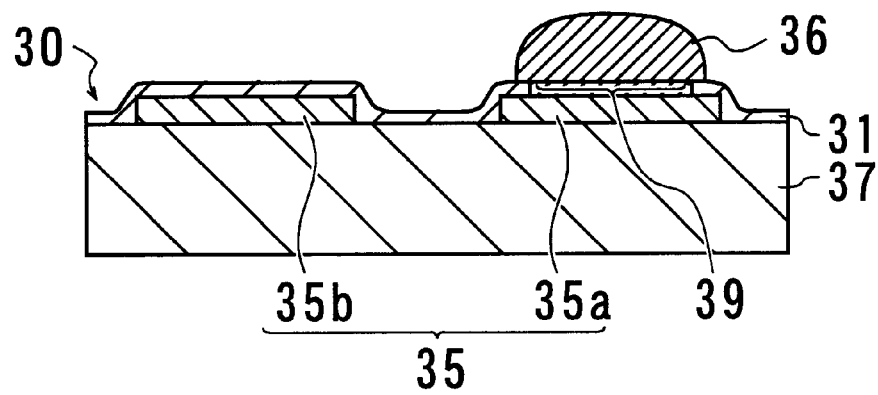
FIG. 2 is a diagram for illustrating a semiconductor element to be connected using an adhesive of the present invention.

Reference 10 in FIG. 1 and reference 30 in FIG. 2 represent a flexible wiring board and a semiconductor element to be bonded, respectively. Flexible wiring board 10 shown in FIG. 1 comprises a base film 11 and a wiring film 15 formed on the top of base film 11. Here, base film 11 consists of a polyethylene terphthalate film having a thickness of 45 $\mu$m and wiring film 15 consists of an aluminium foil having a thickness of 25 $\mu$m patterned in a predetermined geometry.

On the other hand, semiconductor element 30 shown in FIG. 2 comprises an element body 31, a wiring film 35 provided on the top of element body 31 and a protective film 37 provided on the side of element body 31 having the wiring film 35, the protective film 37 having an opening 39 at a predetermined location. Here, semiconductor element 30 has a thickness of 0.3 mm and wiring film 35 is formed on a square having a side length of 4 mm.

Wiring films 15, 35 of the semiconductor element 30 and flexible wiring board 10 comprise connector parts 15a, 35a serving for the connection described later and wiring parts 15b, 35b running around in flexible wiring board 10 and semiconductor element 30 and connected at one end to connector parts 15a, 35a, respectively. Here, each one of connector parts 15a, 35a and wiring parts 15b, 35b is shown.

Opening 39 in protective film 37 is located on connector part 35a of semiconductor element 30. In the opening 39 is provided a bump 36 upright on connector part 35a with the top of bump 36 projecting from the surface of protective film 37. Here, opening 39 having a square bottom having a side length of 100 $\mu$m is formed in protective film 37, after which a bump body is formed in opening 39 by electroplating and a plating layer of gold is further formed on the surface of the top of the bump body to form a bump 36 consisting of the plating layer and bump body.

The flexible wiring board 10 and semiconductor element 30 are bonded by first applying the adhesive of the present invention prepared by the process described above on the side of flexible wiring board 10 having wiring film 15 to form an adhesive layer.

Reference 20 in FIG. 3(a) represents such an adhesive layer, which is filled between adjacent members of wiring film 15 of flexible wiring board 10 so that wiring film 15 is buried in adhesive layer 20.

Then, the side of semiconductor element 30 having protective film 37 and the side of flexible wiring board 10 having adhesive layer 20 are opposed to each other (FIG. 3(b)) so that the top of bump 36 comes into close contact with the top of adhesive layer 20 while aligning bump 36 on semiconductor element 30 to face connector part 15a of the flexible wiring board 10.

Then, the assembly is heated under pressure, in particular under conditions of 210° C. for 5 seconds with a pressure of 9.8 N applied all over semiconductor element 30. The viscosity of adhesive layer 20 decreases by heating, whereby a part of adhesive layer 20 having a decreased viscosity is displaced from the surface of the top of bump 36 under pressure and the remaining adhesive layer 20 is sandwiched between the top of bump 36 and connector part 15a so that conductive particles 25 in adhesive layer 20 enter into the surface of the top of bump 36 and the surface of connector part 15a.

When adhesive layer 20 heats up above a predetermined temperature, the latent curing agent in adhesive layer 20 melts. When the molten latent curing agent is mixed with the thermosetting resins, the latent curing agent reacts with the thermosetting resins to polymerize the thermosetting resins, whereby adhesive layer 20 hardens. Flexible wiring board 10 and semiconductor element 30 are bonded via the thus hardened adhesive layer 20.

Reference 1 in FIG. 3(c) represents an electric device obtained by bonding flexible wiring board 10 and semiconductor element 30, in which wiring films 15, 35 of the electric device 1 are electrically connected via bump 36.

Not only flexible wiring board 10 and semiconductor element 30 are mechanically connected via adhesive layer 20 but also wiring parts 15b, 35b of their wiring films 15, 35 are insulated from each other because of the insulating properties of adhesive layer 20.

Conductive particles having an average diameter of from 10 nm or more to 90 nm or less in the adhesive never break through the protective film of the semiconductor element under pressure even if the thickness of the protective film of the semiconductor element is small.

Example 1 relates to the adhesive and electric device 1 prepared by the processes described above, which were subjected to evaluation testing for "viscosity", "dispersion of conductive particles", "connection resistance" and "short circuit" as follows.

Viscosity

The viscosity of the adhesive of Example 1 was measured using a rotary viscometer (JIS K7117-2). Here, measurements were made under conditions of a temperature of 25° C. and a rotation speed of the rotary viscometer of 20 $min^{-1}$.

Dispersion of Conductive Particles

After the adhesive of Example 1 was left at room temperature for a week, it was visually observed to assess whether or not conductive particles in the adhesive separated.

Evaluation standards are as follows. o: Conductive particles did not separate; x: Conductive particles separated and precipitated.

Connection Resistance

Electric device 1 of Example 1 was measured for connection resistance before and after storage for 500 hours under conditions of high temperature and high humidity of 85° C., 85% relative humidity. Evaluation standards are based on the measured value of connection resistance as follows. o: less than 100 mΩ: Δ: from 100 mΩ or more to 500 mΩ or less; x: more than 500 mΩ.

Short Circuit

Electric device 1 after storage at high temperature and high humidity in the testing for "connection resistance" above was tested for short circuit in wiring films 15, 35. Evaluation standards are as follows. o: No short circuit occurred; x: Short circuit occurred. The evaluation results are shown in Table 1 below.

Further, overall evaluation was made as "o" if all these evaluation results were "o", or "x" if one or more results were "x".

The results of these individual evaluations and the overall evaluation are shown in Table 1 below together with the specific surface areas of conductive particles 25.

TABLE 1

Average diameters, contents, specific surface areas and various test results of conductive particles

|  | Average diameter (nm) | Particle content (vol %) | Specific surface area ($m^2/g$) | Viscosity (Pa · s) | Particle dispersion | Connection resistance Before high temperature and high humidity testing | Connection resistance After high temperature and high humidity testing | Short circuit testing | Overall evaluation |
|---|---|---|---|---|---|---|---|---|---|
| Example 1 | 10 | 2.0 | 69.4 | 150 | o | o | o | o | o |
| Example 2 | 95 | 2.0 | 18.9 | 85 | o | o | o | o | o |
| Example 3 | 50 | 2.0 | 13.2 | 60 | o | o | o | o | o |
| Example 4 | 90 | 2.0 | 7.3 | 48 | o | o | o | o | o |
| Example 5 | 50 | 0.2 | 13.2 | 15 | o | o | o | o | o |
| Example 6 | 50 | 10 | 13.2 | 520 | o | o | o | o | o |
| Comparative example 1 | 5 | 2.0 | 85.2 | 360 | o | Δ | X | o | X |
| Comparative example 2 | 100 | 2.0 | 4.0 | 13 | X | o | o | X | X |
| Comparative example 3 | 2000 | 2.0 | 0.68 | 11 | X | o | o | X | X |
| Comparative example 4 | 50 | 0.1 | 13.2 | 14 | o | o | X | o | X |
| Comparative example 5 | 50 | 12 | 13.2 | 1100 | o | o | o | X | X |

EXAMPLES 2–4

Conductive particles 25 having an average diameter of 10 nm used in Example 1 above were replaced by three types of conductive particles 25 having average diameters of 35 nm, 50 nm and 90 nm to prepare adhesives of Examples 2–4, respectively, according to the same procedure and the same mixing ratio as in Example 1. Further, a semiconductor element 30 and a flexible wiring board 30 used in Example 1 were bonded by the same procedure as in Example 1 using adhesives of Examples 2–4 to prepare electric devices 1 of Examples 2–4.

These adhesives and electric devices 1 of Examples 2–4 were evaluated under the same conditions as in Example 1.

The results of these evaluations and the specific surface areas of conductive particles 25 contained in conductive adhesives of Examples 2–4 are shown in Table 1 above.

Adhesives and electric devices of Examples 5, 6 and Comparative examples 1–4 were also subjected to evaluation testing for "viscosity", "dispersion of conductive particles", "connection resistance" and "short circuit" under the same conditions as in Example 1, and the results and the specific surface area of conductive particles in each adhesive are shown in Table 1 above.

EXAMPLES 5, 6

Adhesives containing conductive particles 25 used in Example 3 above at 0.2 vol % and 10 vol % of the total adhesives were prepared by the same procedure as in Example 3 to give adhesives of Example 5 and 6, respectively, and electric devices 1 of Examples 5 and 6.

COMPARATIVE EXAMPLES 1–3

The conductive particles used in Example 1 were replaced by three types of conductive particles having average diameters of 5 nm, 100 nm and 2000 nm to prepare adhesives of Comparative examples 1–3, respectively, and electric devices 1 of Comparative examples 1–3 according to the same procedure and the same mixing ratio as in Example 1.

COMPARATIVE EXAMPLES 4, 5

Adhesives of Comparative example 4, 5 and electric devices of Comparative examples 4 and 5 were prepared by the same procedure as in Example 3, 5 and 6 except that the conductive particles used in Examples 3, 5 and 6 having an average diameter of 50 nm were added at 0.1 vol % and 12 vol % of the total adhesives, respectively.

Table 1 above shows that evaluation results of testing for "dispersion of conductive particles", "connection resistance" and "short circuit" are good in Examples 1–6 containing conductive particles 25 having an average diameter of from 10 nm or more to 90 nm or less at from 0.2 vol % or more to 10 vol % or less of the total adhesives, confirming that flexible wiring board 10 and semiconductor element 30 can be firmly connected by using adhesives of the present invention.

However, the results of testing for "connection resistance" were poor in Comparative example 1 containing conductive particles having an average diameter of 5 nm and Comparative example 4 containing conductive particles at 0.1 vol % because less amounts of conductive particles enter into the surfaces of bumps and connector parts.

On the contrary, the results of testing for "connection resistance" were good but the results of testing for "dispersion of conductive particles" were poor in Comparative examples 2, 3 containing conductive particles having an average diameter of 100 nm or more. This is because the large particle diameters mean small specific surface areas of less than 5 m$^2$/g, which makes it easier for conductive particles to precipitate in adhesives. The results of testing for "short circuit" were also poor in Comparative examples 2 and 3. This is probably because conductive particles having such a large diameter as 100 nm or more broke through the protective film during connection to cause short circuit in the wiring films.

In Comparative example 4 containing conductive particles at 0.1 vol % of the total adhesive, the results of testing for "connection resistance" were poor because too small amounts of conductive particles entered into the bumps and connector parts. On the contrary, the results of testing for "short circuit" were poor in Comparative example 5 containing conductive particles at 12 vol % of the total adhesive because conductive particles overlapped between the flexible wiring board and the semiconductor element to break through the protective layer.

EXAMPLE 7

Next, an adhesive film made of an adhesive of the present invention is explained.

Forty parts by weight of a phenoxy resin (available from Union Carbide under trade name "PKHH") belonging to the thermosetting resin, 20 parts by weight of a naphthalene-type epoxy resin (available from Dainippon Ink & Chemicals, Incorporated under trade name "HP4032D") also belonging to the thermosetting resin and 38 parts by weight of a latent curing agent (available from Asahi Kasei Epoxy Co. Ltd. under trade name "HX3721", average particle diameter 5 μm) and 2 parts by weight of a coupling agent (available from Nippon Unicar under trade name "A-187") as additives were mixed to give an insulating adhesive component.

Then, the insulating adhesive component was combined with conductive particles to give an adhesive consisting of the insulating adhesive component and the conductive particles. The conductive particles used here were metal particles of palladium having an average diameter of 60 nm, and mixed with the insulating adhesive component at 4 vol % of the total volume of the total adhesive.

Then, 100 parts by weight of the mixture of the insulating adhesive component and the conductive particles were combined with 20 parts by weight each of toluene and ethyl acetate as organic solvents, and the mixed solution was stirred until the thermosetting resins in the insulating adhesive component were completely dissolved to prepare an adhesive solution.

Figure 4A:
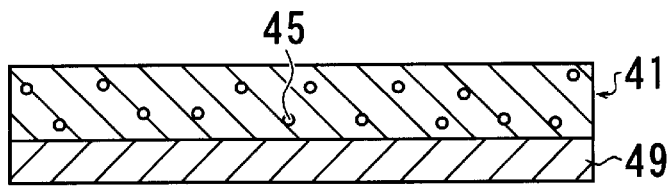
FIGS. 4(a), (b) is a diagram for illustrating a process for preparing an adhesive film of the present invention.

Then, the adhesive solution was applied in a uniform thickness on the top of a separator (release liner) 49 to form an adhesive layer 41 (FIG. 4(a)). Reference 45 in FIG. 4(a) represents conductive particles dispersed in adhesive layer 41.

Figure 4B:
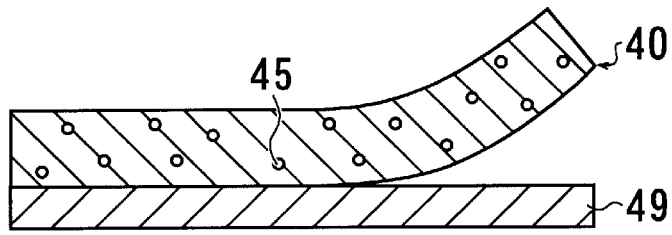

Then, the assembly was dried under conditions of 80° C. in a heat-drying oven to completely evaporate the organic solvent, and then separated from the separator (FIG. 4(b)) to give an adhesive film 40 of the present invention made of the adhesive.

Figure 5A:
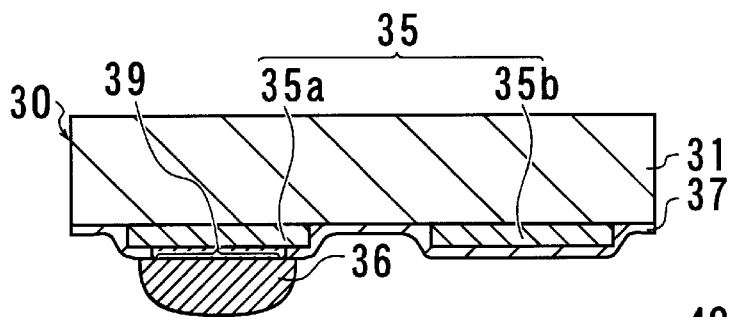
FIGS. 5(a), (b) is a diagram for illustrating a process for connecting a semiconductor element and a flexible wiring board using an adhesive film of the present invention.

Reference 40 in FIG. 5(a) represents the adhesive film of the present invention prepared in the process described above.

Now, a process for connecting a semiconductor element and a flexible wiring board using the adhesive film 40 is explained.

References 10, 30 represent the same flexible wiring board and semiconductor element as used in electric device 1, respectively in Example 1 above, and the flexible wiring board 10 and semiconductor element 30 are connected by first opposing wiring film 15 of flexible wiring board 10 and protective film 37 of semiconductor element 30 to each other with adhesive film 40 inserted therebetween as shown in FIG. 5(a).

Then, adhesive film 40 is sandwiched between semiconductor element 30 and flexible wiring board 10 while aligning bump 36 on semiconductor element 30 to face connector part 15a of flexible wiring board 10.

Then, the assembly is heated under pressure (under the same heating and pressure conditions as in Example 1 above), so that a part of adhesive film 40 is displaced from the top of bump 36 and the remaining part of adhesive film 40 is sandwiched between bump 36 and connector part 15a, whereby conductive particles 45 contained therein enter into the surfaces of bump 36 and connector part 15a to connect wiring films 15, 35.

At the same time, adhesive film 40 hardens by heating so that flexible wiring board 10 and semiconductor element 30 are also mechanically connected.

Figure 5B:
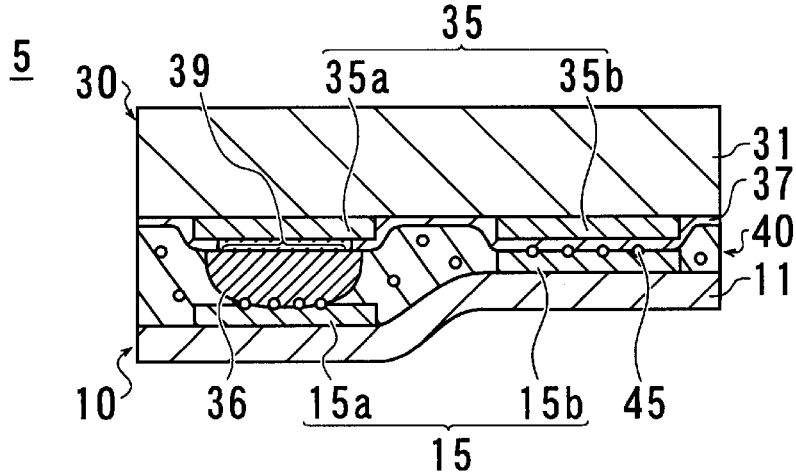

Reference 5 in FIG. 5(b) represents an electric device obtained by connecting flexible wiring board 10 and semiconductor element 30.

Example 7 relates to the electric device 5, which was subjected to evaluation testing for "dispersion of conductive particles", "connection resistance" and "short circuit" under the same conditions as in Example 1 above. The results of these evaluations and the specific surface area of conductive particles are shown in Table 2 below.

TABLE 2

Type of metal, average diameters, contents, specific surface area and various test results of conductive particles

| | | | | | Connection resistance | | | |
| | | | | | Before high | After high | | |
| | | | | Specific | temperature | temperature | | |
| | | Average | Particle | surface | and high | and high | Short | |
| | | diameter | content | area | humidity | humidity | circuit | Overall |
| | Type of metal | (nm) | (Vol %) | (m²/g) | testing | testing | testing | evaluation |
| Example 7 | Pd | 60 | 4.0 | 9.5 | ○ | ○ | ○ | ○ |
| Example 8 | Cu | 65 | 4.0 | 10.3 | ○ | ○ | ○ | ○ |
| Example 9 | Fe | 70 | 4.0 | 10.3 | ○ | ○ | ○ | ○ |
| Example 10 | Ag | 90 | 4.0 | 6.4 | ○ | ○ | ○ | ○ |

EXAMPLES 8–10

Conductive particles 45 used in Example 7 were replaced by conductive particles 45 made of copper having an average diameter of 65 nm to prepare an adhesive film 40 according to the same procedure and the same mixing ratio as in Example 7, and the adhesive film 40 was used to prepare an electric device 5 of Example 8.

Examples 9 and 10 relate to the cause using conductive particles 45 made of iron having an average diameter of 70 nm and made of silver having an average diameter of 90 nm, respectively.

The electric devices 5 of Examples 8–10 were evaluated for "dispersion of conductive particles", "connection resistance" and "short circuit" under the same conditions as in Example 1 above. The results of these evaluations and the specific surface areas of conductive particles contained in adhesive films 40 of Examples 8–10 are shown in Table 2 above.

Table 2 above shows that high evaluation results were obtained in each test in Examples 7–10 using conductive particles 45 made of metals other than nickel. It was confirmed from these results that high connection reliability is obtained when any type of conductive particles having an average diameter of from 10 nm or more to 90 nm or less are used.

Although the foregoing descriptions relate to the case using thermosetting resins such as epoxy resins or phenoxy resins in insulating adhesive components, the present invention is not limited thereto.

For example, thermosetting resins may be replaced by UV-curable resins such as acrylic monomers or acrylic oligomers. In this case, an adhesive layer consisting of an adhesive or an adhesive film is inserted between a flexible wiring board 10 and a semiconductor element 30 and the assembly is irradiated with UV rays to cure the adhesive layer.

In case where thermosetting resin are used, although preferably such may be epoxy resins, phenoxy resins or both, they are not limited to epoxy resins ore phenoxy resins but include any suitable thermosetting resin.

Optional additives that may be included in the adhesive are not limited to coupling agents or latent curing agents, either, but include various ones, though curing agents such as latent curing agents are preferably added when epoxy resins are used as thermosetting resins.

The method for mixing conductive particles and insulating adhesive components is not specifically limited, but may be any conventional dispersion method using rolls, bead mills, dissolvers, etc.

The process for preparing conductive particles having an average diameter of 90 nm or less (metal microparticles) includes gas evaporation, and especially suitable for the present invention is the active plasma-induced metal fusion process in which metal feed is evaporated by plasma arc melting.

Figure 6:
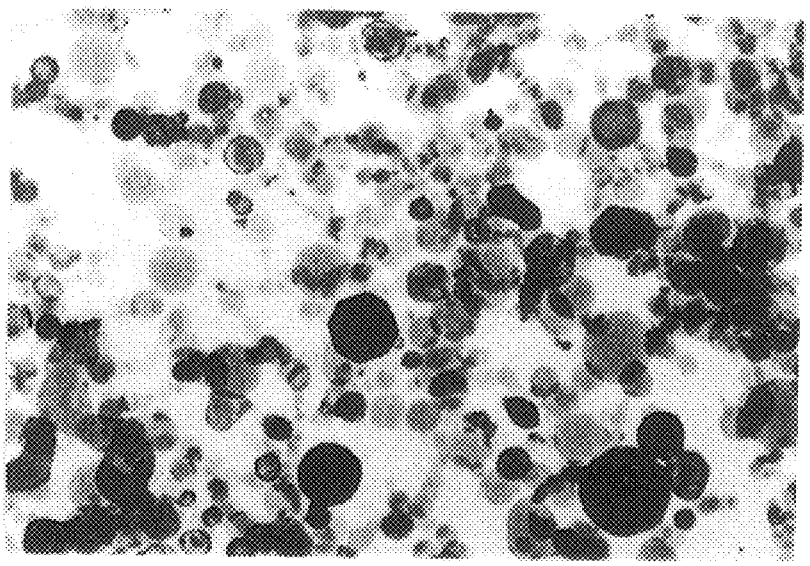
FIG. 6 is a microphotograph of conductive particles used in an adhesive of the present invention.

FIG. 6 shows a microphotograph of conductive particles (nickel particles having an average diameter of 50 nm) obtained by the active plasma-induced metal fusion process at a magnification of 120,000. The distance of 0.6 cm in FIG. 6 corresponds to the actual distance of 50 nm.

Figure 7:
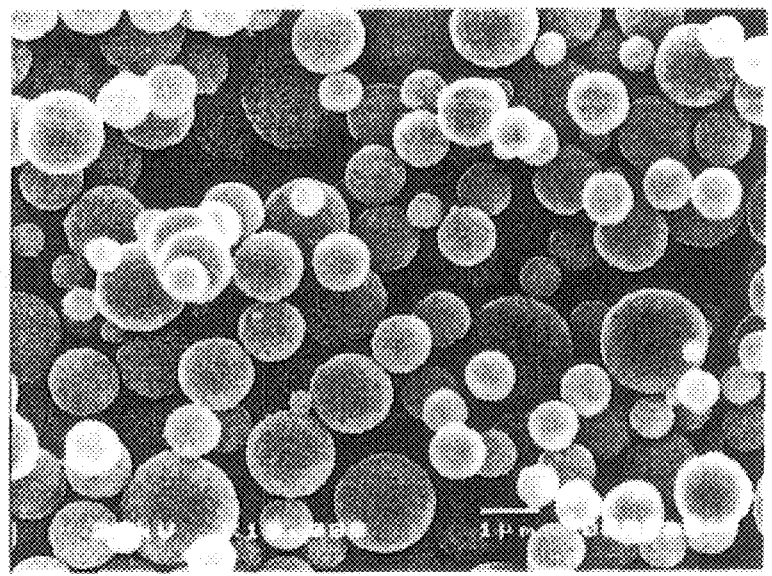
FIG. 7 is a microphotograph of conductive particles used in an adhesive of the prior art.
Figure 8A:
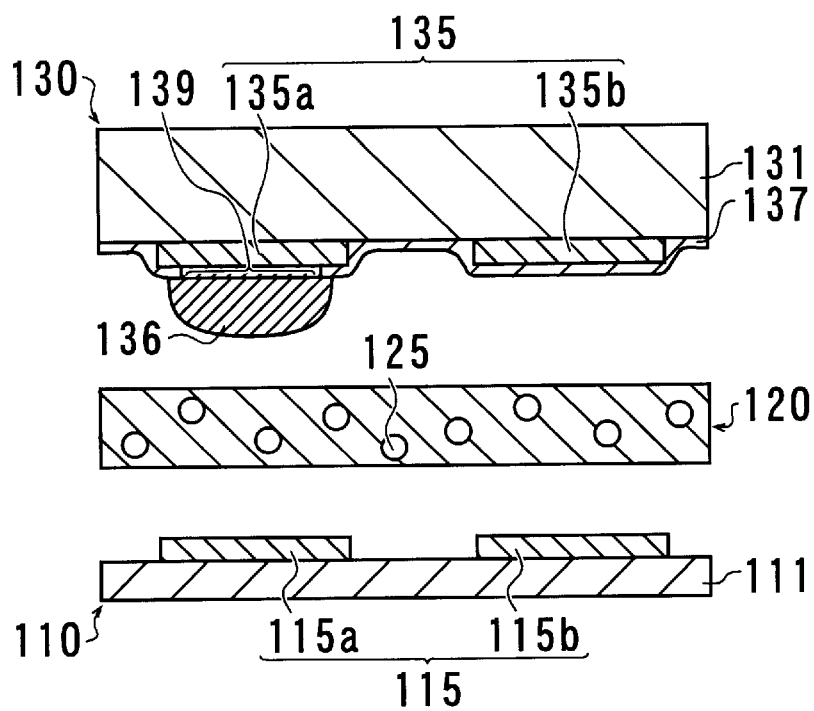
FIGS. 8(a), (b) is a diagram for illustrating a process for connecting a semiconductor element and a flexible wiring board using an adhesive film of the prior art.
Figure 8B:
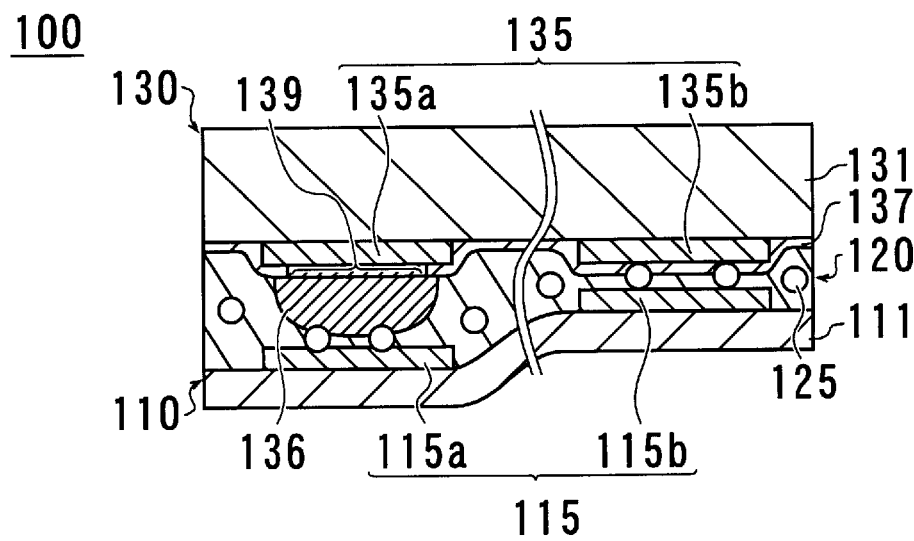

FIG. 7 shows a microphotograph of conductive particles (nickel particles having an average diameter of 2 μm) normally used in the prior art, at a magnification of 7,500. The distance of 1.5 cm in FIG. 7 corresponds to the actual distance of 2 μm.

FIGS. 6 and 7 show that the active plasma-induced metal fusion process allows conductive particles having a smaller diameter to be prepared than those of conductive particles of the prior art.

The active plasma-induced metal fusion process also allows conductive particles having not only a small diameter but also a homogeneous particle system with low impurities to be prepared in large amounts. If two or more metals are used to prepare metal microparticles via the active plasma-induced metal fusion process, conductive particles consisting of metal alloy microparticles can also be obtained.

Insulating adhesive components contain various additives such as thermosetting resins or latent curing agents. When conductive particles representing a total volume exceeding 0.1% on the basis of the total volume of the insulating adhesive components and conductive particles are added, a semiconductor element and a flexible wiring board can be reliably connected. Further, when the added conductive particles represent a total volume less than 12% on the basis of the total volume of the insulating adhesive components and conductive particles, short circuits induced by conductive particles between adjacent wiring film members can be avoided even when a flexible wiring board without insulating layer on the wiring film is bonded.

Latent curing agents contained in insulating adhesive components are dispersed but not dissolved in adhesives, but become dissolved to react with epoxy resins to harden the adhesives once the adhesives are heated above a predetermined temperature. Thus, adhesives of the present invention can be heated above a predetermined temperature to bond objects. This predetermined temperature depends on the latent curing agents and may be, for example, above about 60° C.

If such an adhesive is applied on the top of a release liner such as release paper and dried and then the release liner is separated, an adhesive film made of the adhesive can be obtained.

As has been described above, adhesives for connecting a semiconductor element and a flexible wiring board with high reliability can be provided according to the present invention.

What is claimed is:

1. An adhesive comprising an insulating adhesive component and conductive particles dispersed in the insulating adhesive component wherein the conductive particles have an average diameter of from 10 nm or more to 90 nm or less.

2. The adhesive of claim 1 wherein the conductive particles contained in the adhesive have a specific surface area of from 5 $m^2/g$ or more to 80 $m^2/g$ or less.

3. The adhesive of claim 1 wherein the conductive particles contained in the adhesive represent a total volume of from more than 0.1% to less than 12% on a basis of the total volume of the insulating adhesive component and the conductive particles.

4. The adhesive of claim 1 wherein the conductive particles are based on at least one metal selected from the group consisting of nickel, palladium, copper, iron and silver.

5. The adhesive of claim 1 wherein the insulating adhesive component comprises an epoxy resin and an imidazole-based latent curing agent.

6. The adhesive of claim 1 wherein the adhesive has a viscosity of 1000 Pa.s or less at 25° C.

7. An adhesive film made of an adhesive in a form of a film comprising an insulating adhesive component and conductive particles dispersed in the insulating adhesive component wherein the conductive particles have an average diameter of from 10 nm or more to 90 nm or less.

8. An electric device comprising a semiconductor element and a wiring board, wherein the semiconductor element is adhesively bonded to the wiring board with the adhesive comprising an insulating adhesive component and conductive particles dispersed in the insulating adhesive component wherein the conductive particles have an average diameter of from 10 nm or more to 90 nm or less.

* * * * *